(12) United States Patent
Kusaka (10) Patent No.: US 6,784,373 B2
(45) Date of Patent: Aug. 31, 2004

(54) PRINTED CIRCUIT BOARD WITH WIRING PATTERN FORMED THEREON BY SCREEN PRINTING AND PROCESS FOR MANUFACTURING THE SAME

(75) Inventor: Akihiro Kusaka, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 10/288,403

(22) Filed: Nov. 4, 2002

(65) Prior Publication Data

US 2003/0102150 A1 Jun. 5, 2003

Related U.S. Application Data

(62) Division of application No. 10/037,733, filed on Jan. 2, 2002, now Pat. No. 6,640,430.

(30) Foreign Application Priority Data

Jan. 16, 2001 (JP) ........................................ 2001-008277

(51) Int. Cl.$^7$ ............................................... H05K 1/03
(52) U.S. Cl. ...................................... 174/255; 361/748
(58) Field of Search ................................ 174/250, 254, 174/255; 361/748, 777–779

(56) References Cited

U.S. PATENT DOCUMENTS

| | | | | |
|---|---|---|---|---|
| 3,754,322 A | * | 8/1973 | Chandler | 29/846 |
| 4,879,433 A | * | 11/1989 | Gillett et al. | 174/117 F |
| 5,045,141 A | * | 9/1991 | Salensky et al. | 156/240 |
| 5,285,057 A | * | 2/1994 | Murohara | 235/492 |
| 5,418,690 A | * | 5/1995 | Conn et al. | 361/794 |
| 6,518,663 B1 | * | 2/2003 | James et al. | 257/734 |

* cited by examiner

Primary Examiner—David A. Zarneke
Assistant Examiner—Jeremy Norris
(74) Attorney, Agent, or Firm—Beyer Weaver & Thomas (57) ABSTRACT

A printed circuit board having an insulating board and a plurality of wiring patterns formed over the insulating board by screen printing and provided with first conductive pattern bent parts and wiring parts linked to the first conductive pattern bent parts. The gaps between adjoining ones of the first conductive pattern bent parts are formed wider than those between those of the wiring parts positioned close to and on both sides of the first conductive pattern bent parts.

6 Claims, 6 Drawing Sheets

PRINTED CIRCUIT BOARD WITH WIRING PATTERN FORMED THEREON BY SCREEN PRINTING AND PROCESS FOR MANUFACTURING THE SAME

CROSS REFERENCE TO RELATED APPLICATIONS

This application is a divisional application of U.S. patent application Ser. No. 10/037,733 filed on Jan. 2, 2002 now U.S. Pat. No. 6,640,430 entitled "PRINTED CIRCUIT BOARD WITH WIRING PATTERN FORMED THEREON BY SCREEN PRINTING AND PROCESS FOR MANUFACTURING THE SAME" by Akihiro KUSAKA from which priority is claimed under 35 U.S.C. §120. This application is incorporated herein by reference in its entirety for all purposes.

The present application is related to U.S. patent application Ser. No. 10/288,398 filed concurrently with the present application entitled "PRINTED CIRCUIT BOARD WITH WIRING PATTERN FORMED THEREON BY SCREEN PRINTING AND PROCESS FOR MANUFACTURING THE SAME" by Akihiro KUSAKA

BACKGROUND OF THE INVENTION

1. Field of the Invention

The present invention relates to a printed circuit board that can be suitably used in electronic devices including video cameras.

2. Description of the Prior Art

To describe a printed circuit board according to the prior art and its manufacturing method with reference to FIG. 9 through FIG. 12, an insulating board 21 consisting of a flexible substrate or the like has a rectangular base 22 provided with fixed contacts (not shown) or the like and a drawn part 23 having a substantially L-shaped overall form.

Figure 9:
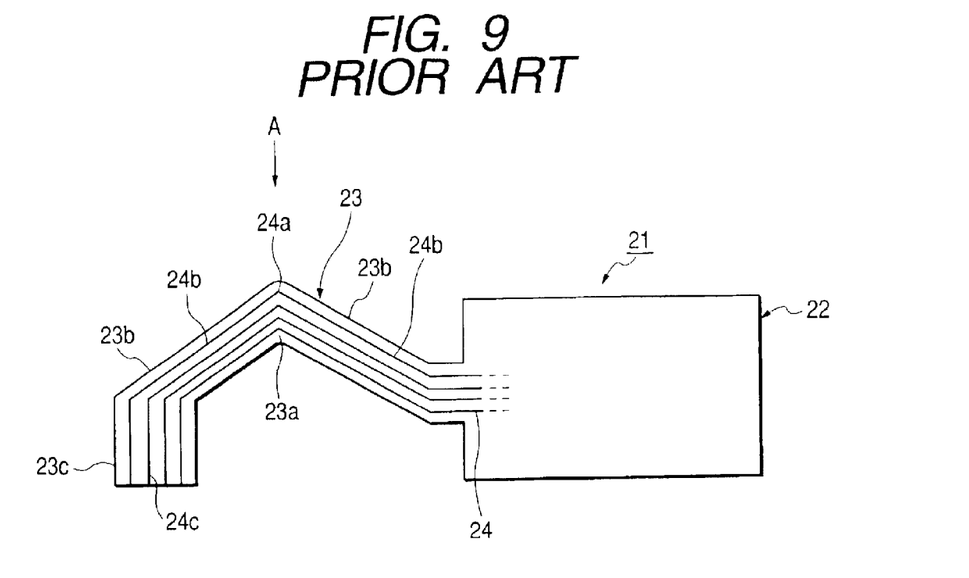
FIG. 9 is an overall plan of a printed circuit board according to the prior art.

This drawn part 23 is substantially L-shaped to stay away from electrical parts or (not shown) or fitting members (not shown) arranged within the electronic device, and has insulating board angled parts 23a bent in an L shape or the like, cables 23b connected to both sides of, and formed in a width equal to, these insulating board angled parts 23a, and leaders 23c formed at an end of the cables 23b.

A plurality of wiring patterns 24 made of silver have conductive pattern bent parts 24a shaped in an L or the like, linear wiring parts 24b connected to both ends of, and having a pattern with equal width to, these conductive pattern bent parts 24a, and linear connecting parts 24c provided at an end of the wiring parts 24b.

The plurality of wiring patterns 24 are formed in parallel by screen printing over the drawn part 23 in a state wherein the conductive pattern bent parts 24a are arranged over the insulating board angled parts 23a of the drawn part 23 of the insulating board 21, the wiring parts 24b are arranged over the cables 23b and the base 22, and further the connecting parts 24c are arranged over the leaders 23c.

The wiring parts 24b formed over the base 22 are connected to fixed contacts (not shown) formed of an electro-conductive pattern over the base 22.

Figure 10:
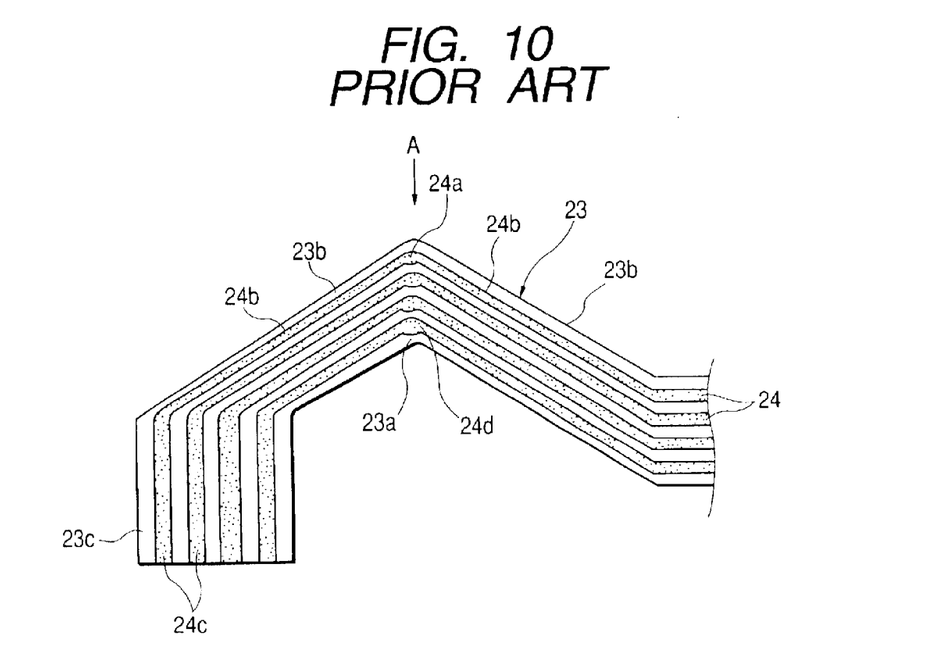
FIG. 10 is an expanded plan of the essential part of the printed circuit board according to the prior art.

The wiring patterns 24 are so designed that the pitch of the patterns in the conductive pattern bent parts 24a be equal to the pitch of the patterns of the wiring parts 24b positioned close to and on both sides of the conductive pattern bent parts 24a, and that the gap width between the conductive pattern bent parts 24a be equal to the gap width between the wiring parts 24b positioned close to and on both sides of the conductive pattern bent parts 24a.

On such a printed circuit board, the connecting parts 24c provided in leaders 23c are connected to a connector (not shown), so that a current from outside is entered into the printed circuit board via the connecting parts 24c or a current from the printed circuit board is supplied outside via the connecting parts 24c.

Figure 11:
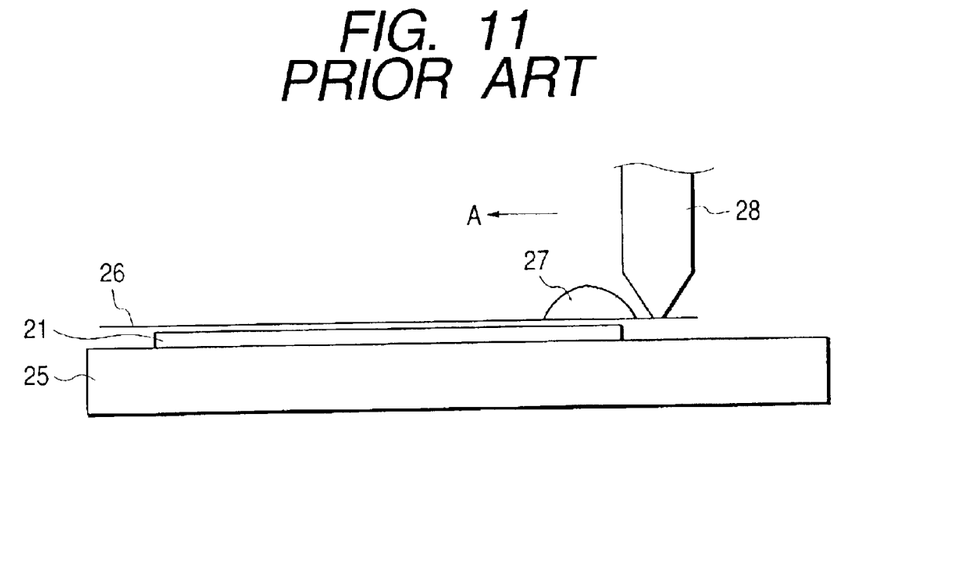
FIG. 11 pertains to the printed circuit board according to the prior art, and in particular to its manufacturing method.

By a manufacturing method for such a printed circuit board according to the prior art by screen printing, as shown in FIG. 11, after the insulating board 21 is mounted on a mount 25, a meshed printing mask 26 is mounted over the insulating board 21.

Next, after painting or otherwise applying silver paste 27 over the printing mask 26, a squeegee 28 is moved in the direction of arrow A to form the plurality of wiring patterns 24 over the insulating board 21 by printing.

Thus, as shown in FIG. 9 and FIG. 10, the squeegee 28 is moved in the direction of arrow A, and first the conductive pattern bent parts 24a are formed by printing, followed by the formation of the wiring parts 24b by printing.

The reason why the squeegee 28 is moved in the direction of arrow A is that the formation of the wiring patterns 24 by printing in a state in which their orthogonal intersections with the squeegee 28 are minimized results in minimization of the running or blurring of patterns. In particular, minimization of orthogonal intersections between the wiring parts 24b having large pattern areas and the moving path of the squeegee 28 serves to reduce the running or blurring of the patterns of the wiring parts 24b.

However, while the conductive pattern bent parts 24a are printed earlier in an orthogonally crossing state than the wiring parts 24b by the movement of the squeegee 28 in the direction of arrow A, the silver paste 27 flows from the peak toward the trough of the ink permeating part of the printing mask 26 for the formation of the conductive pattern bent parts 24a during the printing of these conductive pattern bent parts 24a.

If, then, the printing conditions lose balance, slight quantities of the silver paste 27 may get caught between the printing mask 26 and the insulating board 21 in corners of the trough of the ink permeating part, and create running parts 24d as shown in FIG. 10.

As a result, these running parts 24d would often short-circuit the wiring patterns 24 among themselves.

Figure 12:
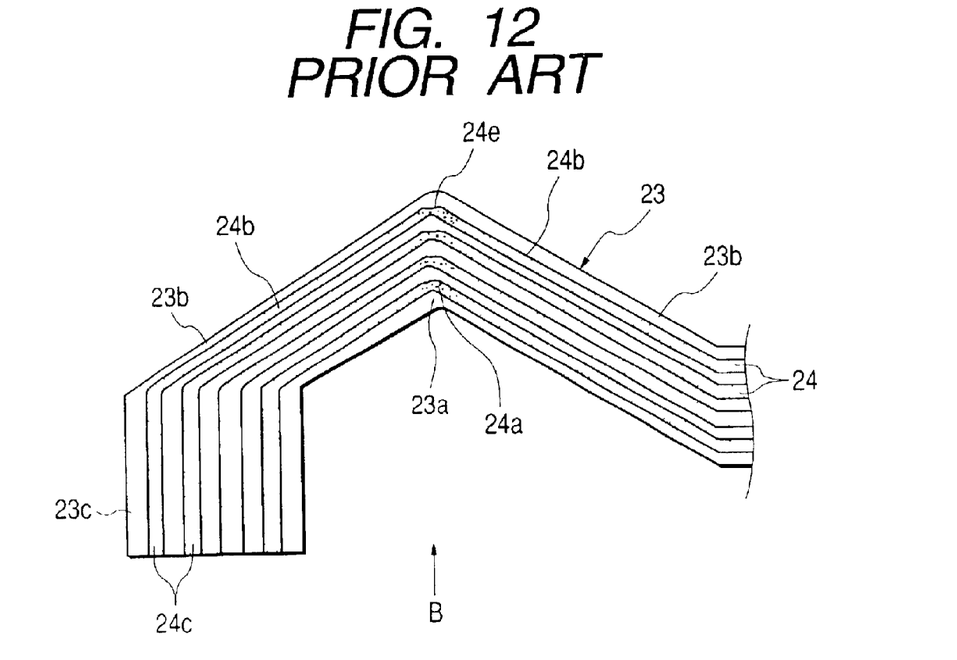
FIG. 12 is another expanded plan of the essential part of the printed circuit board according to the prior art.

Or if in the conventional printed circuit board and its manufacturing method the squeegee 28 is moved in the direction of arrow B first to form the connecting parts 24c by printing and then the conductive pattern bent parts 24a are formed by printing after the wiring parts 24b are printed as shown in FIG. 12, blurred parts 24e of the silver paste 27 (see FIG. 12) may be caused to occur and possibly invite wire breaking in the conductive pattern bent parts 24a by stagnant air or the like gathering in the corners at the top of the ink permeating part of the printing mask 26 for forming the conductive pattern bent parts 24a.

As printed circuit boards are required to be reduced in size along with the advance in the size compression of electronic devices in which they are to be used, the wiring patterns 24 are more narrowly spaced between one another and also reduced in width, running parts 24d and blurred parts 24e would give rise to the risks of short-circuiting and wire breaking in the resultant narrower conductive pattern bent parts 24a.

In the conventional printed circuit board and its manufacturing method, since gaps between the conductive pattern bent parts 24a of the wiring patterns 24 are designed to be as wide as gaps between the wiring parts 24b positioned near their two sides and screen printing is carried out in the direction of arrow A, running parts 24d arise in the trough of the conductive pattern bent parts 24a, making the wiring patterns 24 susceptible to short-circuiting between each other.

Or if screen printing is carried out in the direction of arrow B, blurred parts 24e may arise at the top of the conductive pattern bent parts 24a, giving rise to the risk of inviting wire breaking.

SUMMARY OF THE INVENTION

In view of these problems, the present invention is intended to provide a more reliable printed circuit board less susceptible to short-circuiting or wire breaking in the conductive pattern bent parts of wiring patterns, and its manufacturing method.

According to a first aspect of the invention, the problems noted above are solved with a configuration having an insulating board and a plurality of wiring patterns formed over this insulating board by screen printing and provided with first conductive pattern bent parts and wiring parts linked to these first conductive pattern bent parts, gaps between adjoining first conductive pattern bent parts are formed wider than those between those of the wiring parts positioned close to and on both sides of the first conductive pattern bent parts.

According to a second aspect of the invention, a pitch of patterns in the first conductive pattern bent parts is formed greater than that of the patterns of those of the wiring parts positioned close to and on both sides of the first conductive pattern bent parts.

According to a third aspect of the invention, a pattern width in the first conductive pattern bent parts is greater than that of the patterns of those of the wiring parts positioned close to and on both sides of the first conductive pattern bent parts.

According to a fourth aspect of the invention, wiring patterns are screen-printed in such a printing direction that the first conductive pattern bent parts are formed by printing earlier than the wiring parts.

According to a fifth aspect of the invention, the insulating board has first insulating board angled parts and cables linked to both sides of these first insulating board angled parts, wherein a width of the first insulating board angled parts is formed greater than that of the cables, the first conductive pattern bent parts are positioned in the first insulating board angled parts, and a plurality of the wiring patterns are provided in a state in which the wiring parts are positioned in the cables.

According to a sixth aspect of the invention, the wiring patterns have second conductive pattern bent parts bent in a direction reverse to the first conductive pattern bent parts and wiring parts linked to these second conductive pattern bent parts, wherein a pattern width in these second conductive pattern bent parts is formed greater than that of the wiring parts positioned close to and on both sides of the second conductive pattern bent parts.

According to a seventh aspect of the invention, the wiring patterns are screen-printed in such a printing direction that the second conductive pattern bent parts are formed by printing after the wiring parts linked to the second conductive pattern bent parts are formed by printing.

According to an eighth aspect of the invention, a pitch of the patterns in the second conductive pattern bent parts is formed greater than that of the patterns of those of the wiring parts positioned close to and on both sides of the second conductive pattern bent parts, and gaps between adjoining ones of the second conductive pattern bent parts are formed wider than those between those of the wiring parts positioned close to and on both sides of the second conductive pattern bent parts.

According to a ninth aspect of the invention, the insulating board has second insulating board angled parts bent in a direction reverse to the first insulating board angled parts and cables linked to both sides of these second insulating board angled parts, wherein a width of the second insulating board angled parts is formed greater than that of the cables, and a plurality of wiring patterns are provided in a state in which the second conductive pattern bent parts are positioned in the second insulating board angled parts and the wiring parts are positioned in the cables.

According to a tenth aspect of the invention, the first insulating board angled parts and the second insulating board angled parts bent in a direction reverse to these first insulating board angled parts are formed adjoining each other, linked by the cables.

According to an eleventh aspect of the invention, there is provided a printed circuit board manufacturing method provided with a plurality of wiring patterns having first conductive pattern bent parts and wiring parts linked to these first conductive pattern bent parts, wherein the wiring patterns are screen-printed on an insulating board in such a printing direction that the first conductive pattern bent parts are formed by printing earlier than the wiring parts, and the gaps between adjoining ones of the first conductive pattern bent parts are formed wider than those between those of the wiring parts positioned close to and on both sides of the first conductive pattern bent parts.

According to a twelfth aspect of the invention, the pitch of patterns in the first conductive pattern bent parts is formed greater than that of the patterns of those of the wiring parts positioned close to and on both sides of the first conductive pattern bent parts.

According to a thirteenth aspect of the invention, the wiring patterns have second conductive pattern bent parts bent in a direction reverse to the first conductive pattern bent parts and wiring parts linked to these second conductive pattern bent parts, wherein the wiring patterns are formed by screen-printing the wiring parts on the insulating board in such a printing direction that the wiring parts linked to the second conductive pattern bent parts are formed by printing earlier than the second conductive pattern bent parts so that the pattern width in these second conductive pattern bent parts is formed greater than that of those of the wiring parts positioned close to and on both sides of the second conductive pattern bent parts.

According to a fourteenth aspect of the invention, there is provided a printed circuit board manufacturing method wherein the pitch of patterns in the second conductive pattern bent parts is formed greater than that of the patterns of those of the wiring parts positioned close to and on both sides of the second conductive pattern bent parts.

According to a fifteenth aspect of the invention, there is provided a printed circuit board manufacturing method wherein the first conductive pattern bent parts and the second conductive pattern bent parts adjoining these first conductive pattern bent parts are screen-printed on the insulating board in a state in which they are linked by the wiring parts.

According to a sixteenth aspect of the invention, there is provided a printed circuit board manufacturing method wherein a plurality of sets of the wiring patterns each consisting of the wiring patterns provided with the first and second conductive pattern bent parts and the wiring parts are formed by screen printing over a large insulating base.

According to a seventeenth aspect of the invention, there is provided a printed circuit board manufacturing method wherein the insulating board having a set of the wiring patterns is formed out of the plurality of the wiring patterns by punching out of the large insulating base.

According to an eighteenth aspect of the invention, there is provided a printed circuit board manufacturing method wherein the large insulating base is punched along the first and second conductive pattern bent parts, the first and second conductive pattern bent parts are positioned in first and second insulating board angled parts of the insulating board, and the wiring parts are positioned in a cable linked to the first and second insulating board angled parts of the insulating board.

According to a nineteenth aspect of the invention, there is provided a printed circuit board manufacturing method wherein the first and second insulating board angled parts are formed to have a greater width than that of the cable by punching out of the large insulating base.

DETAILED DESCRIPTION OF THE PREFERRED EMBODIMENTS

Figure 1:
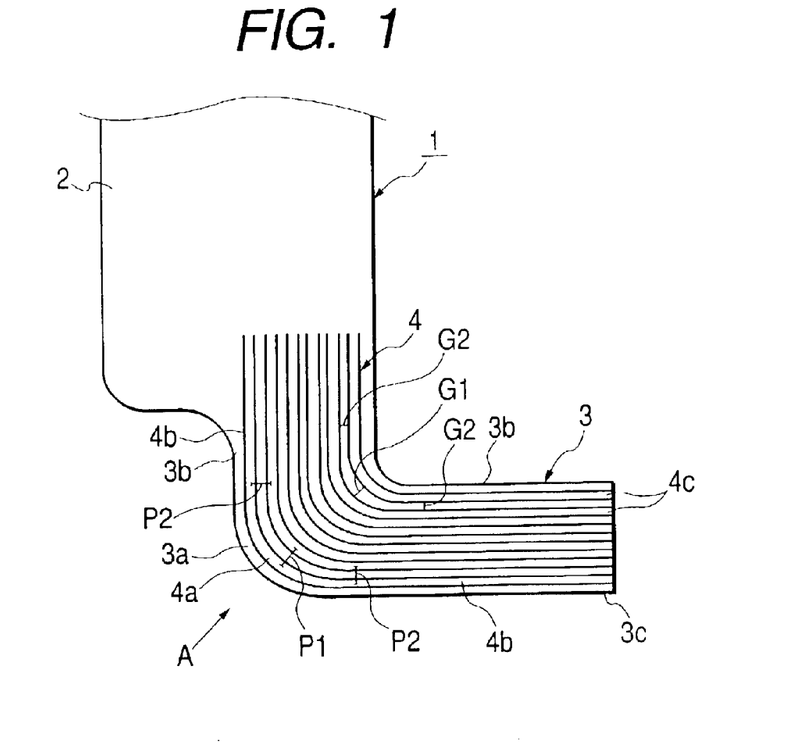
FIG. 1 is a plan of the essential part of a printed circuit board, which is a first preferred embodiment of the present invention.
Figure 2:
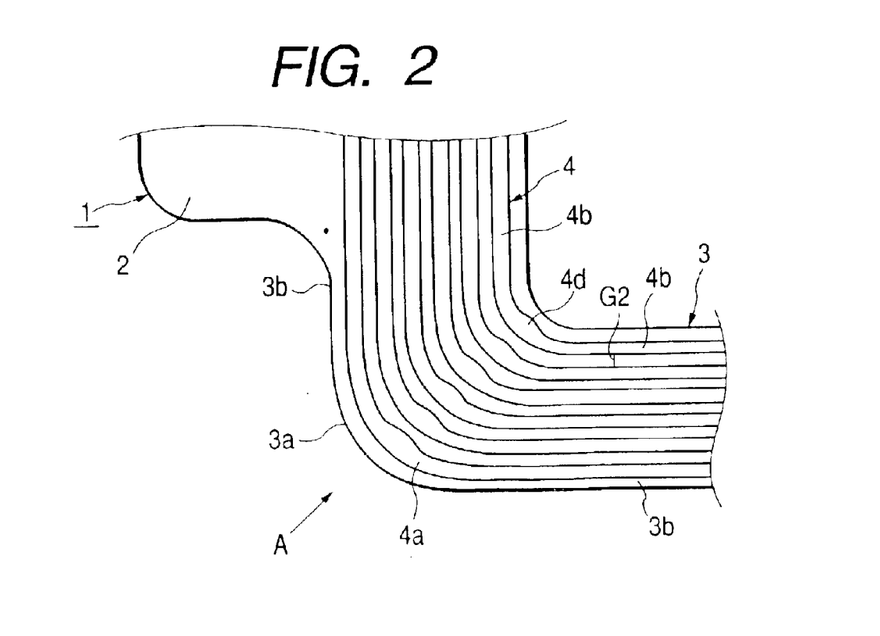
FIG. 2 is an expanded plan of the essential part of the printed circuit board, which is the first embodiment of the invention.

To explain the drawings illustrating the printed circuit board and its manufacturing method according to the present invention, FIG. 1 is a plan of the essential part of a printed circuit board, which is a first preferred embodiment of the invention; FIG. 2 is an expanded plan of the essential part of the printed circuit board, which is the first embodiment of the invention; and FIG. 3 illustrates a manufacturing method for the printed circuit board according to the invention.

Figure 4:
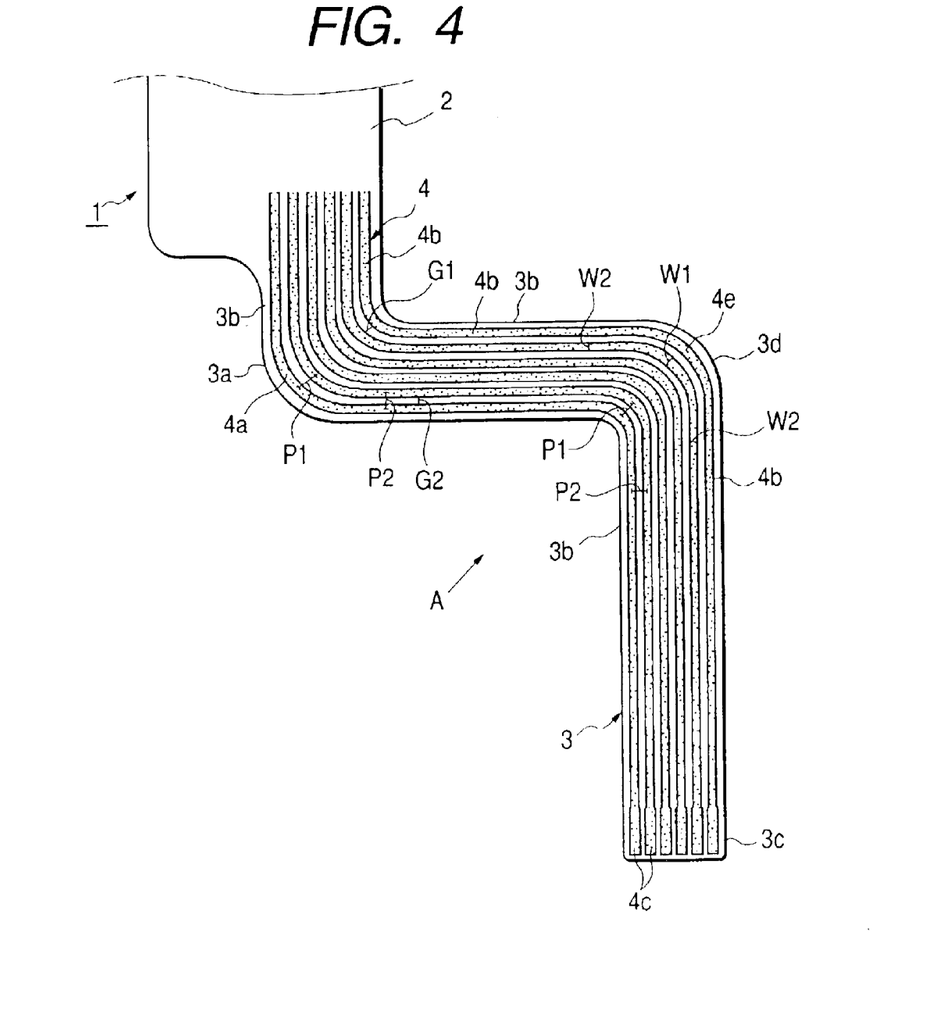
FIG. 4 is a plan of the essential part of a printed circuit board, which is a second preferred embodiment of the invention.
Figure 5:
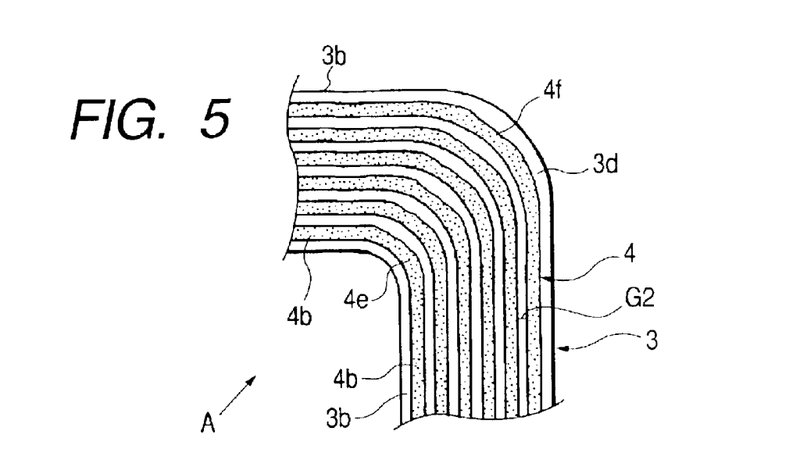
FIG. 5 is an expanded plan of the essential part of the printed circuit board, which is the second embodiment of the invention.
Figure 6:
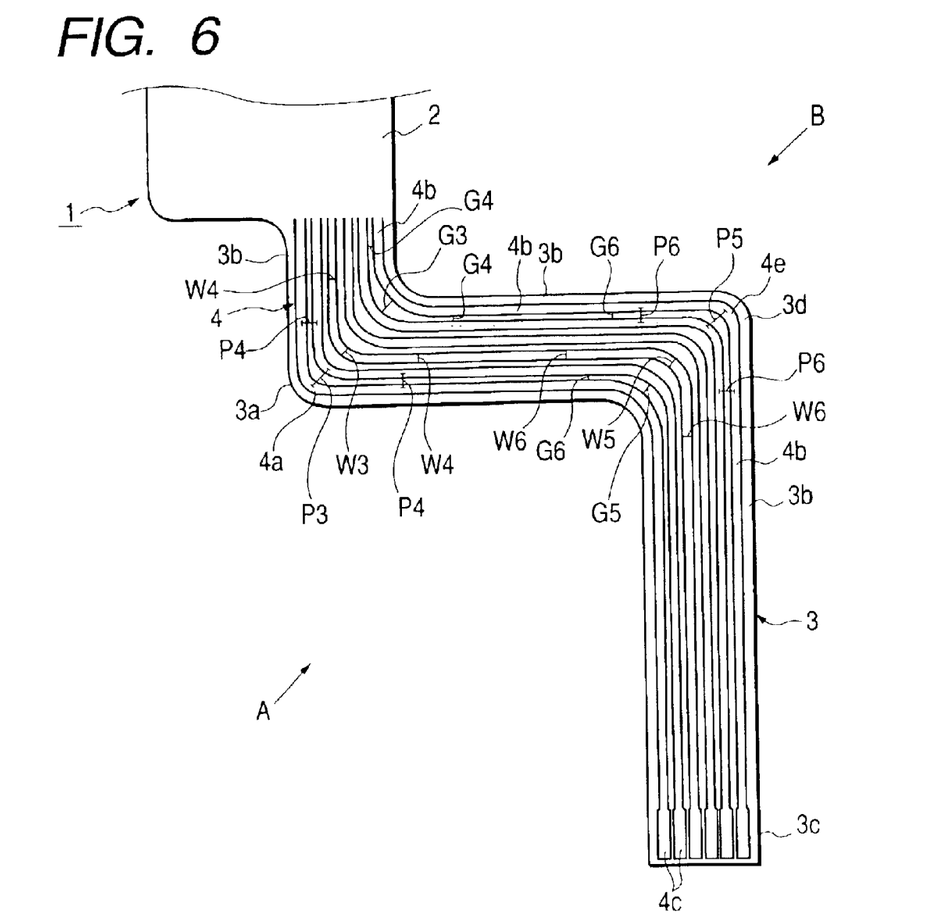
FIG. 6 is a plan of the essential part of a printed circuit board, which is a third preferred embodiment of the invention.
Figure 7:
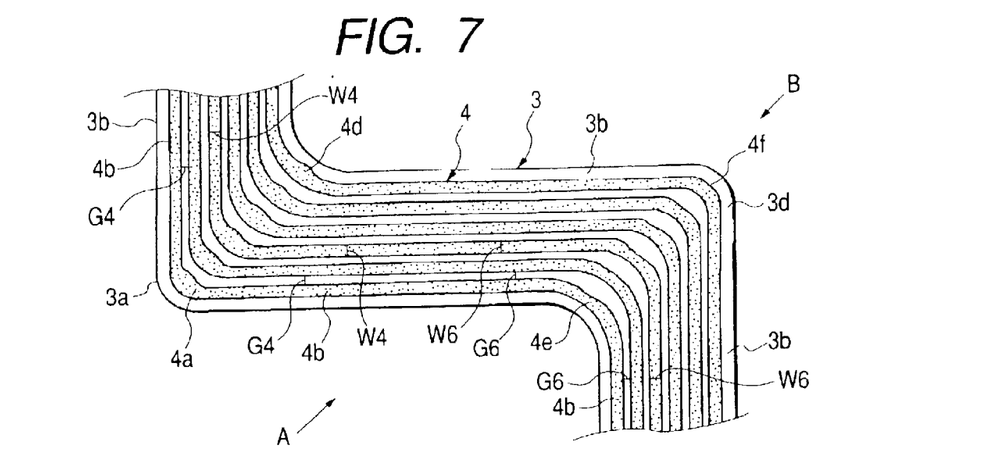
FIG. 7 is an expanded plan of the essential part of the printed circuit board, which is the third embodiment of the invention.

FIG. 4 is a plan of the essential part of a printed circuit board, which is a second preferred embodiment of the invention; FIG. 5, an expanded plan of the essential part of the printed circuit board, which is the second embodiment of the invention; FIG. 6, a plan of the essential part of a printed circuit board, which is a third preferred embodiment of the invention; FIG. 7, an expanded plan of the essential part of the printed circuit board, which is the third embodiment of the invention; and FIG. 8 pertains to a printed circuit board manufacturing method according to the invention, and in particular to the manufacture of the printed circuit board, which is the third embodiment of the invention, from a large insulating base.

Figure 3:
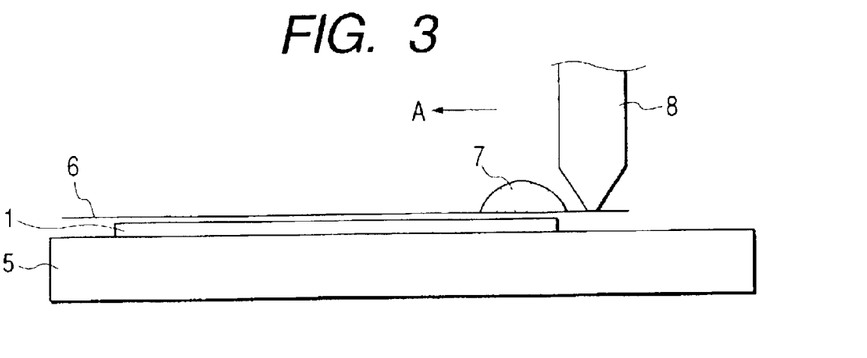
FIG. 3 illustrates a manufacturing method for the printed circuit board according to the invention.

To describe the printed circuit board and its manufacturing method according to the invention with reference to FIG. 1 through FIG. 3, an insulating board 1 consisting of a flexible film or the like has a rectangular base 2 provided with fixed contacts (not shown) and the like, and a drawn part 3 having an L-shaped overall form.

This drawn part 3 is L-shaped to stay away from electrical parts (not shown) or fitting members (not shown) arranged within the electronic device, and has insulating board angled parts 3a bent in an L shape or the like, cables 3b connected to both sides of, and formed in a width narrower than, these insulating board angled parts 3a, and leaders 3c formed at an end of the cables 3b.

A plurality of wiring patterns 4 consisting of silver have L-shaped conductive pattern bent parts 4a, linear wiring parts 4b connected to both ends of these conductive pattern bent parts 4a and equal in pattern width to the conductive pattern bent parts 4a, and linear connecting parts 4c provided at an end of the wiring parts 4b.

The pitch (the center-to-center distance between adjoining patterns) P1 of patterns in the conductive pattern bent parts 4a is formed to be greater than the pitch P2 of patterns of those of the wiring parts 4b positioned close to and on both sides of the conductive pattern bent parts 4a, and the gap width (the distance between side edges or adjoining patterns) G1 between the conductive pattern bent parts 4a to be greater than the gap width G2 between the wiring parts 4b.

The plurality of wiring patterns 4 are disposed in parallel in a state in which the conductive pattern bent parts 4a are arranged in the wide insulating board angled parts 3a of the drawn part 3 of the insulating board 1, the wiring parts 4b are arranged in the cables 3b and the base 2, and the connecting parts 4c are arranged in the leader 3c, and formed by screen printing of the same step on the drawn part 3.

The wiring parts 4b formed over the base 2 are connected to fixed contacts (not shown) formed of electroconductive patterns over the base 2.

This printed circuit board, with its connecting parts 4c provided in the leader 3c being connected to a connector (not shown), allows a current from outside to be entered into it via the connecting parts 4c or a current from it to be supplied outside via the connecting parts 4c.

In the manufacturing method for this printed circuit board by screen printing according to the invention, as illustrated in FIG. 3, after the insulating board 1 is mounted on the mount 5, a meshed printing mask 6 is mounted over the insulating board 1.

Then, after painting or otherwise applying silver paste 7 over the printing mask 6, a squeegee 8 is moved in the direction of arrow A to form the plurality of wiring patterns 4 over the insulating board 1 by printing.

Thus, as shown in FIG. 1 and FIG. 2, the squeegee 8 is moved in the direction of arrow A, and first the conductive pattern bent parts 4a are formed by printing, followed by the formation of the wiring parts 4b by printing.

The reason why the squeegee 8 is moved in the direction of arrow A is that formation of the wiring patterns 4 by printing by minimizing their orthogonal intersections with the squeegee 8 results in minimization of the running or blurring of patterns. In particular, minimization of orthogonal intersections between the wiring parts 4b having large pattern areas and the moving path of the squeegee 8 serves to reduce the running or blurring of patterns of the wiring parts 4b.

However, while the conductive pattern bent parts 4a are printed earlier in an orthogonally crossing state than the wiring parts 4b by the movement of the squeegee 8 in the direction of arrow A, the silver paste 7 flows from the peak toward the trough of the ink permeating part of the printing mask 6 for the formation of the conductive pattern bent parts 4a during the printing of these conductive pattern bent parts 4a.

Then, depending on the printing conditions including the viscosity of the silver paste 7 and the printing speed, slight quantities of the silver paste 7 may get caught between the printing mask 6 and the insulating board 1 in corners of the trough of the ink permeating part, and create running parts 4d as shown in FIG. 2.

As printed circuit boards are required to be reduced in size along with the advance in the size compression of electronic devices in which they are to be used, the wiring patterns 4 are more narrowly spaced between one another and also reduced in width.

However, as the gap width G1 between the conductive pattern bent parts 4a is formed greater than the gap width G2 of those of the wiring parts 4b positioned on both sides and close to the conductive pattern bent parts 4a, it will be difficult for any running part 4d that may arise to invite short-circuiting between the wiring patterns 4.

Also, as the pattern pitch P1 in the conductive pattern bent parts 4a is greater than the pattern pitch P2 in the wiring parts 4b positioned on both sides and close to the conductive pattern bent parts 4a, the pattern width in the conductive pattern bent part 4a can be equalized to the pattern width of those of the wiring parts 4b positioned on both sides and close to the conductive pattern bent parts 4a.

Therefore, even if the gap width G1 between the conductive pattern bent parts 4a is increased, there is no need to narrow the pattern width of the conductive pattern bent parts 4a, resulting in effective prevention of such troubles as increased resistance to continuity or wire breaking even if the pattern width is reduced.

FIG. 4 and FIG. 5 illustrate a second preferred embodiment of the present invention. In this second embodiment, the drawn part 3 is arranged by having the cables 3b form second insulating board angled parts 3d which are bent in a direction reverse to the insulating board angled parts 3a of the first embodiment and wider than the cables 3b.

The wiring patterns 4 are bent further in an L shape from those in the first embodiment, and are provided with conductive pattern bent parts (second conductive pattern bent parts) 4e having a wider pattern width W1, the linear wiring parts 4b which are linked to both sides of these conductive pattern bent parts 4e and have a narrower pattern width W2 than the pattern width W1 of the conductive pattern bent parts 4e, and the linear connecting parts 4c provided at an end of the wiring parts 4b.

Thus the pattern width W1 in the conductive pattern bent parts 4e is formed greater than the pattern width W2 of those of the wiring parts 4b positioned on both sides and close to the conductive pattern bent parts 4e.

The pattern pitch P1 in the conductive pattern bent parts 4e is formed greater than the pattern pitch P2 of those of the wiring parts 4b positioned on both sides and close to the conductive pattern bent parts 4e, and the gap width between the conductive pattern bent parts 4e is set equal to the gap width between those of the wiring parts 4b positioned on both sides and close to the conductive pattern bent parts 4e.

The plurality of wiring patterns 4 are disposed in parallel in a state in which the conductive pattern bent parts 4e are arranged in the insulating board angled parts 3d of the drawn part 3 of the insulating board 1, the wiring parts 4b are arranged in the cables 3b and the connecting parts 4c are arranged in the leader 3c, and formed by screen printing of the same step on the drawn part 3.

The conductive pattern bent parts 4e are adjacently connected via the wiring parts 4b to the conductive pattern bent parts 4a formed in the insulating board angled parts 3a, and other aspects of the configuration are the same as their respective counterparts in the first embodiment. Therefore, the same constituent parts are assigned respectively the same reference numbers, and their description is dispensed with.

The manufacturing method for this printed circuit board, which is the second embodiment of the invention, by screen printing is accomplished using an apparatus shown in FIG. 3. Thus the plurality of wiring patterns 4 are formed by printing over the insulating board 1 by moving the squeegee 8 in the direction of arrow A in FIG. 4 and FIG. 5.

Then, first the connecting parts 4c are formed by printing, and next the wiring parts 4b are printed, followed by the formation of the conductive pattern bent parts 4e by printing.

At the time of this printing, printing of the conductive pattern bent parts 4e which constitute part of the wiring patterns 4 is more susceptible to the occurrence of blurred parts 4f of the silver paste 7 (see FIG. 5) or the like in the conductive pattern bent parts 4e resulting from stagnant air or the like gathering in the corners at the top of the ink permeating part of the printing mask 6 for forming the conductive pattern bent parts 4e as the squeegee 8 begins to move in a direction substantially at a right angle to the direction of the patterns after the wiring parts 4b on both sides are printed.

As printed circuit boards are required to be reduced in size along with the advance in the size compression of electronic devices in which they are to be used, the wiring patterns 4 are more narrowly spaced between one another and also reduced in width.

However, as the conductive pattern bent parts 4e where the blurred parts 4f or the like are apt to occur have a greater pattern width, even if any blurred parts 4f occurs in the conductive pattern bent parts 4e, there is more of the residual pattern in the conductive pattern bent parts 4e, and accordingly no wire breaking will arise, resulting in enhanced reliability.

In the second embodiment of the invention show in FIG. 4 and FIG. 5, while the movement of the squeegee 8 causes the conductive pattern bent parts 4a and the wiring parts 4b to be formed by printing over the insulating board angled parts 3a and the cables 3b positioned on the side of these insulating board angled parts 3a at the same time as on the side of the insulating board angled parts 3d, their configuration and their manufacturing method are similar to those of the first embodiment, and accordingly their description is dispensed with.

Although the foregoing description of the second embodiment referred to an example in which the second insulating board angled parts 3d are formed adjacent to and continuous from the first insulating board angled parts 3a, the drawn part 3 having the second insulating board angled parts 3d may as well be provided on an edge different from the edge of the base 2 on which the drawn part 3 having the first insulating board angled parts 3a is provided.

FIG. 6 and FIG. 7 illustrate a third preferred embodiment of the present invention. In this third embodiment, as in the second embodiment just described, the drawn part 3 is arranged by having the cables 3b form the second insulating board angled parts 3d which are bent in a direction reverse to the first insulating board angled parts 3a and wider than the cables 3b.

The width of the first and second insulating board angled parts 3a and 3d is formed greater than that of the cables 3b.

In the insulating board angled parts 3a, the first conductive pattern bent parts 4a are formed and in the cables 3b, the wiring parts 4b are formed. Further, the pattern pitch P3 in the conductive pattern bent parts 4a is greater than the pattern pitch P4 of those of the wiring parts 4b positioned on both sides and close to the conductive pattern bent parts 4a, and the gap width G3 between the adjacent conductive pattern bent parts 4a is formed greater than the gap width G4 between those of the wiring parts 4b positioned on both sides and close to the conductive pattern bent parts 4a.

Furthermore, the pattern width W3 in the conductive pattern bent parts 4a is formed greater than the pattern width W4 between those of the wiring parts 4b positioned on both sides and close to the conductive pattern bent parts 4a.

In the insulating board angled parts 3d adjacently linked to the insulating board angled parts 3a via the cables 3b, the second conductive pattern bent parts 4e are formed, and in the cables 3b positioned on both sides of the insulating board angled parts 3d, the wiring parts 4b are formed. Further, the pattern pitch P5 in the conductive pattern bent parts 4e is greater than the pattern pitch P6 of those of the wiring parts 4b positioned on both sides and close to the conductive pattern bent parts 4e, and the gap width G5 between the adjacent conductive pattern bent parts 4e is formed greater than the gap width G6 between those of the wiring parts 4b positioned on both sides and close to the conductive pattern bent parts 4e.

Furthermore, the pattern width W5 in the conductive pattern bent parts 4e is formed greater than the pattern width W6 of those of the wiring parts 4b positioned on both sides and close to the conductive pattern bent parts 4e.

In a state in which neither running nor blurring can arise, the pitches P3 and P5 are formed to be equal, and so are the pitches P4 and P6 and the gap widths G3 and G5 and the gap widths G4 and G6.

The pattern widths W3 and W5 are also formed to be equal, and so are the pattern widths W4 and W6.

Other aspects of the configuration are the same as their respective counterparts in the second embodiment. Therefore, the same constituent parts are assigned respectively the same reference numbers, and their description is dispensed with.

The manufacturing method for this printed circuit board, which is the third embodiment of the invention, by screen printing is accomplished using an apparatus shown in FIG. 3. Thus the plurality of wiring patterns 4 are formed by printing over the insulating board 1 by moving the squeegee 8 in the direction of arrow A in FIG. 6 and FIG. 7.

Then, first the connecting parts 4c are formed by printing, and then the conductive pattern bent parts 4a are printed, followed by the printing of those of the wiring parts 4b near the conductive pattern bent parts 4a, while on the side of the conductive pattern bent parts 4e, the conductive pattern bent parts 4e are printed after those of the wiring parts 4b near the conductive pattern bent parts 4e are printed.

Printing in this manner uses on the conductive pattern bent parts 4a side a greater pattern pitch P3 than the pattern pitch P4 of those of the wiring parts 4b positioned on both sides and close to the conductive pattern bent parts 4a, and the gap width G3 between the conductive pattern bent parts 4a is greater than the gap width G4 of those of the wiring parts 4b positioned on both sides and close to the conductive pattern bent parts 4a. Accordingly, even if any running part 4d arises, it is difficult for short-circuiting between the wiring patterns 4 to arise.

Furthermore, as a result of printing in this manner, on the conductive pattern bent parts 4e side where the pattern width W5 of the conductive pattern bent parts 4e is formed greater than the pattern width W6 of those of the wiring parts 4b positioned on both sides and close to the conductive pattern bent parts 4e, even if any blurred part 4f or the like occurs in the conductive pattern bent parts 4e, there is more of the residual pattern in the conductive pattern bent parts 4e than according to the prior art, and accordingly no wire breaking will arise, resulting in enhanced reliability.

In the third embodiment of the invention described above, it is possible to form the wiring patterns 4 by moving the squeegee 8 in the direction of arrow B in FIG. 6 and FIG. 7.

Thus, as the squeegee 8 is moved in the direction of arrow B to carry out screen printing, first the conductive pattern bent parts 4e are formed by printing, followed by the printing of the wiring parts 4b close to the conductive pattern bent parts 4e, and then the conductive pattern bent parts 4a are printed after the wiring parts 4b close to the conductive pattern bent parts 4a are printed.

Printing in this manner uses on the conductive pattern bent parts 43 side a greater pattern pitch P5 than the pattern pitch P6 of those of the wiring parts 4b positioned on both sides and close to the conductive pattern bent parts 43, and the gap width G5 between the conductive pattern bent parts 4e is greater than the gap width G6 of those of the wiring parts 4b positioned on both sides and close to the conductive pattern bent parts 43. Accordingly, even if any running part 4d arises, it is difficult for short-circuiting between the wiring patterns 4 to arise.

Printing in this manner uses on the conductive pattern bent parts 4a a greater pattern width W3 than the pattern width W4 of those of the wiring parts 4b positioned on both sides and close to the conductive pattern bent parts 4a, and even if any blurring part 4f or the like arises, there is more of the residual pattern in the conductive pattern bent parts 4a than according to the prior art. Accordingly no wire breaking will arise, resulting in enhanced reliability.

Thus this third embodiment of the invention is more flexible because it is adaptable to printing in both directions, that of arrow A and that of arrow B.

To add, while the third embodiment of the invention described has the second insulating board angled parts 3d formed adjacent to and continuous from the first insulating board angled parts 3a, the drawn part 3 having the second insulating board angled parts 3d may as well be provided on an edge different from the edge of the base 2 on which the drawn part 3 having the first insulating board angled parts 3a is provided.

Figure 8:
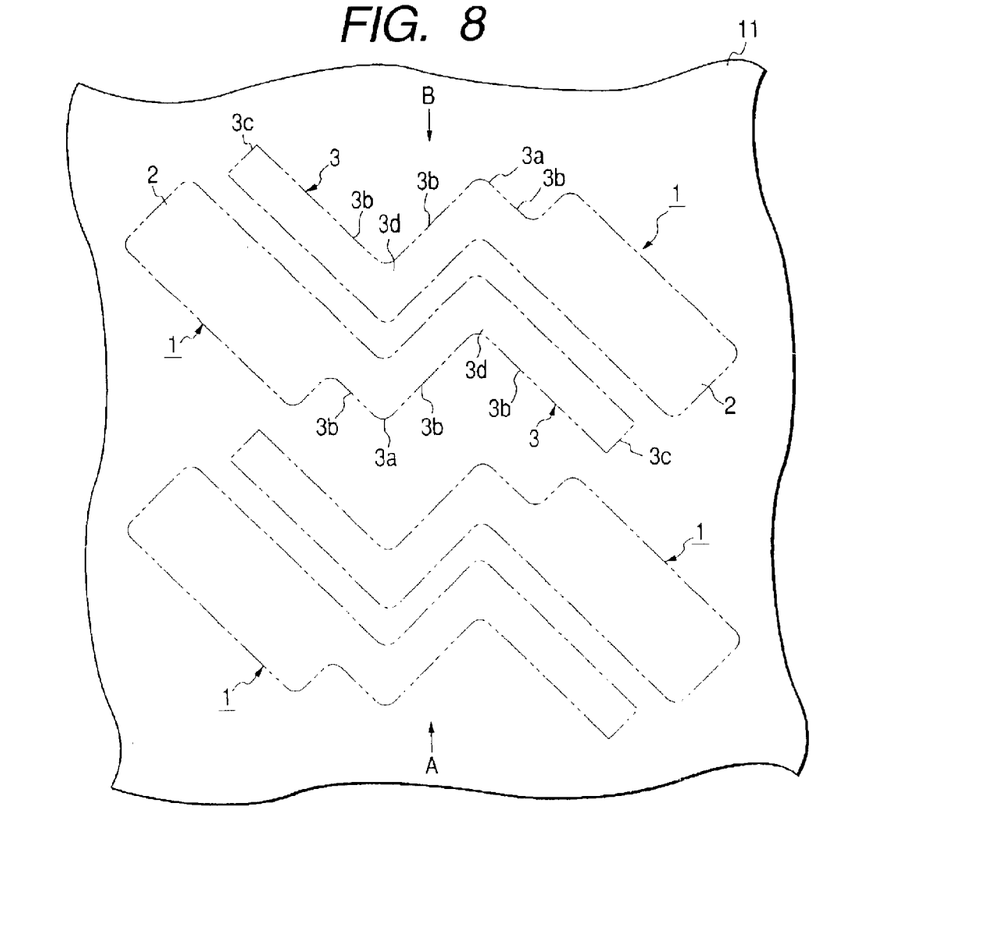
FIG. 8 pertains to a printed circuit board manufacturing method according to the invention, and in particular to the manufacture of the printed circuit board, which is the third embodiment of the invention, from a large insulating base.

FIG. 8 shows an alternative version of the manufacturing method for the printed circuit board, which is the third embodiment of the invention shown in FIG. 6 and FIG. 7. In this version, the squeegee 8 is moved in the direction of either arrow A or arrow B over a large insulating base 11, and a plurality of wiring patterns 4 shown in FIG. 6 are formed by printing in the areas indicated by two-dot chain lines, followed by the punching of the base 2 and the drawn part 3 along the first and second conductive pattern bent parts 4a and 4e and the wiring parts 4b in the positions indicated by two-dot chain lines to form an insulating board 1 for each set.

Incidentally, while the foregoing description of this embodiment of the invention referred to has a configuration in which the second insulating board angled parts 3d are formed adjacent to and continuous from the first insulating board angled parts 3a, the drawn part 3 having the second insulating board angled parts 3d may as well be provided on an edge different from the edge of the base 2 on which the drawn part 3 like the one shown in FIG. 1 or the drawn part 3 having the first insulating board angled parts 3a is provided.

However, in a configuration in which individual insulating boards 1 are arranged alternately as shown in FIG. 8 and which has the conductive pattern bent parts 4a and 4e bent in the reverse direction to each other, both the gap width and the pattern width in the conductive pattern bent parts should be wider than those in the wiring parts.

To add, in the printed circuit board embodying the invention as described above, the wiring patterns except connecting parts to outside including the connecting parts 4c and fixed contacts (not shown) may be covered with an insulating resist layer.

The wiring patterns according to the invention may consist of silver or a mixture of silver and carbon, the latter's content being small enough not to affect the electroconductivity of silver.

The insulating board according to the invention, though a configuration comprising the base 2 and the belt-shaped drawn part 3 was referred to in the foregoing description, may have a square or rectangular overall shape or consist of only a belt-shaped drawn part.

Further, the cables 3b may have a non-linear shape, curvilinear or otherwise.

As in the printed circuit board according to the present invention the gap width G1 between adjoining first conductive pattern bent parts 4a is greater than the gap width G2 between those of the wiring parts 4b positioned on both sides and close to the conductive pattern bent parts 4a, even if any running part 4d arises in the conductive pattern bent parts 4a it is difficult for short-circuiting to occur between wiring patterns 4, resulting in enhanced reliability.

Further, as the pattern pitch P1 in the first conductive pattern bent parts 4a is set greater than the pattern pitch P2 of those of the wiring parts 4b positioned on both sides and close to the conductive pattern bent parts 4a, there is no need to narrow the pattern width in the first conductive pattern bent parts 4a, and accordingly in the absence of any running part 4d, too, an appropriate pattern width can be secured.

Also the invention can be suitably applied to narrowed spacing between wiring patterns 4 along with reductions in the size accompanying the advance in the dimensional compression of electronic devices in which they are to be used.

Moreover, as the pattern width W3 in the first conductive pattern bent parts 4a is greater than the pattern width W4 of those of the wiring parts 4b positioned on both sides and close to the conductive pattern bent parts 4a, greater freedom can be allowed in the choice of printing direction.

Also, as the wiring patterns 4 are screen-printed in such a printing direction that the first conductive pattern bent parts 4a be formed by printing earlier than the wiring parts 4b, the wiring parts 4b can be patterned following the patterning of the conductive pattern bent parts 4a, resulting in the elimination of the risk of adjacent wiring patterns 4 coming into contact with each other.

Moreover, the insulating board 1 has the first insulating board angled parts 3a and the cables 3b linked to both ends of these first insulating board angled parts 3a, the width of the first insulating board angled parts 3a is formed greater than that of the cables 3b, and the plurality of wiring patterns 4 are formed in a state in which the first conductive pattern bent parts 4a are positioned in the first insulating board angled parts 3a and the wiring parts 4b are positioned in the cables 3b, with the result that the insulating board 1 is large only in some part of the first insulating board angled parts 3a, which means no obstacle to size compression.

The wiring patterns 4 have the second conductive pattern bent parts 4e bent in a direction reverse to the first conductive pattern bent parts 4a and the wiring parts 4b linked to these second conductive pattern bent parts 4e, and the pattern width W1 (W5) in these second conductive pattern bent parts 4e is greater than the pattern width W2 (W6) of those of the wiring parts 4b positioned on both sides and close to the second conductive pattern bent parts 4e, with the result that, even if any blurred part 4f or the like arises in the conductive pattern bent parts 4e in the process of formation by printing, there is more of the residual pattern than according to the prior art, and therefore no wire breaking will arise, resulting in enhanced reliability.

Also, as the wiring patterns 4 are screen-printed in such a printing direction that the second conductive pattern bent parts 4e are formed by printing after the wiring parts 4b linked to the second conductive pattern bent parts 4e are formed by printing, the pattern of the conductive pattern bent parts 4e is formed following the pattern formation of the wiring parts 4b, with the result that the silver paste 7 can smoothly permeate the wiring parts 4b and, even if any blurred part 4f or the like arises in the conductive pattern bent parts 4e, the widened pattern serves to reduce wire breaking.

Further, as the pattern pitch P5 in the second conductive pattern bent parts 4e is greater than the pattern pitch P6 of those of the wiring parts 4b positioned on both sides and close to the second conductive pattern bent parts 4e, and the gap width G5 in the second conductive pattern bent parts 4e is formed greater than the gap width G6 of those of the wiring parts 4b positioned on both sides and close to the second conductive pattern bent parts 4e, greater freedom can be allowed in the choice of printing direction, resulting in enhanced productivity.

The insulating board 1 has the second insulating board angled parts 3d bent in a direction reverse to the first insulating board angled parts 3a and the cables 3b linked to both sides of these second insulating board angled parts 3d, the width of the second insulating board angled parts 3d is formed greater than that of the cables 3b, and the plurality of wiring patterns 4 are arranged in a state in which the second conductive pattern bent parts 4e are positioned in the second insulating board angled parts 3d and the wiring parts 4b are positioned in the cables 3b, with the result that the insulating board 1 is large only in some part of the first insulating board angled parts 3a, which means no obstacle to size compression.

Also, as the first insulating board angled parts 3a and the second insulating board angled parts 3d bent in a direction reverse to these first insulating board angled parts 3a are formed adjacently linked by the cables 3b, the freedom of the drawn part 3 can be enhanced, making it possible to provide printed circuit boards adaptable to many different forms.

It is further made possible to provide a highly reliable manufacturing method which can effectively prevent short-circuiting between the wiring patterns 4 because the plurality of wiring patterns 4, having the first conductive pattern bent parts 4a and the wiring parts 4b linked to these first conductive pattern bent parts 4a, are provided, and the wiring patterns 4 are screen-printed over the insulating board 1 in such a printing direction that the first conductive pattern bent parts 4a are formed by printing earlier than the wiring parts 4b, and the gap width G1 between the adjoining first conductive pattern bent parts 4a is greater than the gap width G2 between those of the wiring parts 4b positioned on both sides and close to the first conductive pattern bent parts 4a.

It is also possible to provide a manufacturing method capable of securing an appropriate pattern width in the absence of any running part 4d, too, because the pattern pitch P1 in the first conductive pattern bent parts 4a is formed greater than the pattern pitch P2 of those of the wiring parts 4b positioned on both sides and close to the second conductive pattern bent parts 4a, thereby eliminating the need to narrow the pattern width in the first conductive pattern bent parts 4a.

It is further possible to provide a manufacturing method excelling in the performance of formation by printing even where there are different conductive pattern bent parts because the wiring patterns 4 have the second conductive pattern bent parts 4e bent in a direction reverse to the first conductive pattern bent parts 4a, the wiring patterns 4 are formed by screen printing over the insulating board 1 in such a printing direction that the wiring parts 4b linked to the second conductive pattern bent parts 4e are formed by printing earlier than the second conductive pattern bent parts 4e so that the pattern width W1 (W5) in these second conductive pattern bent parts 4e is formed greater than the pattern width W2 (W6) of those of the wiring parts 4b positioned on both sides and close to the second conductive pattern bent parts 4e.

It is also possible to provide a manufacturing method capable of ensuring insulation from adjoining wiring patterns 4 by securing an appropriate pattern width in the absence of any blurred part 4f, too, because the pattern pitch P5 of the second conductive pattern bent parts 4e is formed greater than the pattern pitch P6 of those of the wiring parts 4b positioned on both sides and close to the second conductive pattern bent parts 4e, thereby eliminating the need to narrow the gap width in the second conductive pattern bent parts 4e.

It is further possible to provide a manufacturing method which can enhance the freedom of the choice of the drawing pattern and facilitate the manufacture of wiring patterns adaptable to many different forms because the wiring patterns are screen-printed over the insulating board 1 in a state in which the first conductive pattern bent parts 4a and the second conductive pattern bent parts 4e adjoining these first conductive pattern bent parts 4a are linked by the wiring parts 4b.

It is also possible to provide a manufacturing method capable of producing many sets of wiring patterns 4 at a time, resulting in enhanced productivity, because a plurality of sets of the wiring patterns each consisting of the wiring patterns 4 provided with the first and second conductive pattern bent parts 4a and 4e and the wiring parts 4b are formed by screen printing over the large insulating board 11.

It is further possible to provide a manufacturing method capable of producing many insulating boards 1 at a time, resulting in enhanced productivity, because the large insulating base 11 is punched to form the insulating boards 1 each having a set of wiring patterns 4 formed from a plurality of sets of wiring patterns.

It is also possible to provide a manufacturing method capable of readily producing the drawn part 3 of a complex shape because the large insulating base 11 is punched along the first and second conductive pattern bent parts 4a and 4e, and pattern formation is carried out in a state in which the first and second conductive pattern bent parts 4a and 4e are positioned in the first and second insulating board angled parts 3a and 3d of the insulating board 1 and the wiring parts 4b are positioned in the cables 3b linked to the first and second insulating board angled parts 3a and 3d of the insulating board 1.

It is further possible to provide a manufacturing method involving no obstacle to size compression and allowing efficient material utilization because the first and second insulating board angled parts 3a and 3d are formed by punching out of the large insulating base 11 to be wider than the cables 3b and accordingly the insulating board 1 is large only in the first and second insulating board angled parts 3a and 3d.

What is claimed is:

1. A printed circuit board having an insulating board and a plurality of wiring patterns formed over the insulating board by screen printing and provided with first conductive pattern bent parts and wiring parts linked to the first conductive pattern bent parts, wherein the gaps between adjoining ones of the first conductive pattern bent parts are formed wider than those between those of the wiring parts positioned close to and on both sides of the first conductive pattern bent parts, and wherein the insulating board has first insulating board angled parts and cables linked to both sides of the first insulating board angled parts, wherein a width of the first insulating board angled parts is formed greater than that of the cables, wherein the first conductive pattern bent parts are positioned in the first insulating board angled parts, and wherein a plurality of the wiring patterns are provided in a state in which the wiring parts are positioned in the cables.

2. A printed circuit board having an insulating board and a plurality of wiring patterns formed over the insulating board by screen printing and provided with first conductive pattern bent parts and wiring parts linked to the first conductive pattern bent parts, wherein the gaps between adjoining ones of the first conductive pattern bent parts are formed wider than those between those of the wiring parts positioned close to and on both sides of the first conductive pattern bent parts, and wherein the wiring patterns have second conductive pattern bent parts bent in a direction reverse to the first conductive pattern bent parts and wiring parts linked to the second conductive pattern bent parts, wherein a pattern width in the second conductive pattern bent parts is formed greater than that of the wiring parts positioned close to and on both sides of the second conductive pattern bent parts.

3. The printed circuit board according to claim 2, wherein the wiring patterns are screen-printed in such a printing direction that the second conductive pattern bent parts are formed by printing after the wiring parts linked to the second conductive pattern bent parts are formed by printing.

4. The printed circuit board according to claim 2, wherein a pitch of patterns in the second conductive pattern bent parts is formed greater than that of the patterns of those of the wiring parts positioned close to and on both sides of the second conductive pattern bent parts, and wherein gaps between adjoining ones of the second conductive pattern bent parts are formed wider than those between those of the wiring parts positioned close to and on both sides of the second conductive pattern bent parts.

5. The printed circuit board according to claim 2, wherein the insulating board has second insulating board angled parts bent in a direction reverse to the first insulating board angled parts and cables linked to both sides of the second insulating board angled parts, wherein a width of the second insulating board angled parts is formed greater than that of the cables, and wherein a plurality of the wiring patterns are provided in a state in which the second conductive pattern bent parts are positioned in the second insulating board angled parts and the wiring parts repositioned in the cables.

6. The printed circuit board according to claim 5, wherein the first insulating board angled parts and the second insulating board angled parts bent in a direction reverse to the first insulating board angled parts are formed adjoining each other, linked by the cables.

* * * * *